United States Patent
Hsiao et al.

(10) Patent No.: US 7,640,652 B2
(45) Date of Patent: Jan. 5, 2010

(54) METHOD OF MAKING A CURRENT SENSING CHIP RESISTOR

(75) Inventors: Shen-Li Hsiao, Hukou Township, Hsinchu County (TW); Shih-Long Wei, Hukou Township, Hsinchu County (TW)

(73) Assignee: Viking Tech Corporation, Hukou Township, Hsinchu County (TW)

( * ) Notice: Subject to any disclaimer, the term of this patent is extended or adjusted under 35 U.S.C. 154(b) by 285 days.

(21) Appl. No.: 11/703,835

(22) Filed: Feb. 8, 2007

(65) Prior Publication Data

US 2008/0194057 A1    Aug. 14, 2008

(51) Int. Cl.
*H01C 17/12* (2006.01)
(52) U.S. Cl. .................................................. 29/620
(58) Field of Classification Search ............ 338/309, 338/227, 306–308, 312–314, 327, 328, 332, 338/334; 438/463, 382–385; 29/610.1, 612, 29/613, 619, 620, 621; 427/102, 103
See application file for complete search history.

(56) References Cited

U.S. PATENT DOCUMENTS

| | | | |
|---|---|---|---|
| 6,492,896 B2 * | 12/2002 | Yoneda | 338/309 |
| 2002/0026706 A1 * | 3/2002 | Kurita | 29/610.1 |
| 2002/0118094 A1 * | 8/2002 | Kambara et al. | 338/309 |
| 2003/0156008 A1 * | 8/2003 | Nakanishi et al. | 338/309 |
| 2004/0075717 A1 * | 4/2004 | O'Brien et al. | 347/71 |

* cited by examiner

*Primary Examiner*—Matthew C Landau
*Assistant Examiner*—Daren Wolverton
(74) *Attorney, Agent, or Firm*—Muncy, Geissler, Olds & Lowe PLLC

(57) ABSTRACT

A method of making a current sensing chip resistor is composed of a resistor manufacturing process which is constituted by a pre-process and a post-process. In addition, a thin-film process is used for the resistor manufacturing process, and the aluminum nitride substrate is used in the thin-film, in association with a technique of flip chip structure of single-side manufacturing process, enabling the resistor to be provided with performances of a high power, a high precision, a high thermal conductivity, a low temperature coefficient, a low noise, and a saving of utilization space of PCB (Printed Circuit Board).

1 Claim, 13 Drawing Sheets

|  | Present Invention | Prior Art |
|---|---|---|
| Power | >2W | 1W |
| Precision | ≤0.5% | 1% |
| Thermal Conductivity | 150~230mW | 15~20mW |
| Space Saving | 30% | None |
| Temperature Coefficient | Low | High |
| Noise | Low | High |

FIG. 12

| Present Invention | Prior Art |
|---|---|
| High Heat Dissipative Aluminum Nitride Substrate Can Withstand Higher Power | Aluminum Oxide Substrate Can Only Withstand Lower Power |
| Thin-Film Process Has a High Precision and a Better Temperature Coefficient | Thin-Film Process Has a Low Precision and a Poor Temperature Coefficient |
| Flip Chip Front-Side Assembly Structure Can Save Space of PCB | Rear-Side Assembly Structure of an Ordinary Surface Mounting Technique |

FIG. 13

METHOD OF MAKING A CURRENT SENSING CHIP RESISTOR

BACKGROUND OF THE INVENTION (a) Field of the Invention

The present invention relates to a method of making a current sensing chip resistor, and more particularly to a manufacturing method, wherein a thin-film process is utilized to make the resistor, and an aluminum nitride (AlN) substrate and a technique of a flip chip structure are used in the process.

(b) Description of the Prior Art

Referring to FIG. 1, a conventional process A for making a resistor includes a rear-side conductor printing A2, a front-side resistor printing A3, a front-side conductor printing A4, a high-temperature baking A5, a glass protective layer printing A6, and a glass protective layer baking A7 on an aluminum oxide ($Al_2O_3$) substrate A1. However, as the aluminum oxide substrate A1 is used in a pre-process, and only a thick-film process is used for the resistor manufacturing process A, the product will have a low power (1 W), a low precision (1%), a low conductivity, a high temperature coefficient, and a high noise. In addition, the resistor manufacturing process A does not use a technique of a flip chip structure of a single-side manufacturing process; therefore, a problem of utilization space of a PCB (Printed Circuit Board) will be increased.

Therefore, how to eliminate the aforementioned shortcomings is a technical issue to be solved by the present inventor.

SUMMARY OF THE INVENTION

The primary object of present invention is to provide a method of making a current sensing chip resistor, wherein a thin-film process is utilized in the resistor manufacturing process, and an aluminum nitride (AlN) substrate and a technique of a flip chip structure is used in the process, such that the resistor can be provided with a high power, a high precision, a high thermal conductivity, and a utilization space of a PCB can be saved.

To enable a further understanding of the said objectives and the technological methods of the invention herein, the brief description of the drawings below is followed by the detailed description of the preferred embodiments.

BRIEF DESCRIPTION OF THE DRAWINGS

FIG. 12 shows a first table of an embodiment of the present invention.

FIG. 13 shows a second table of an embodiment of the present invention.

DETAILED DESCRIPTION OF THE PREFERRED EMBODIMENTS

Figure 1:
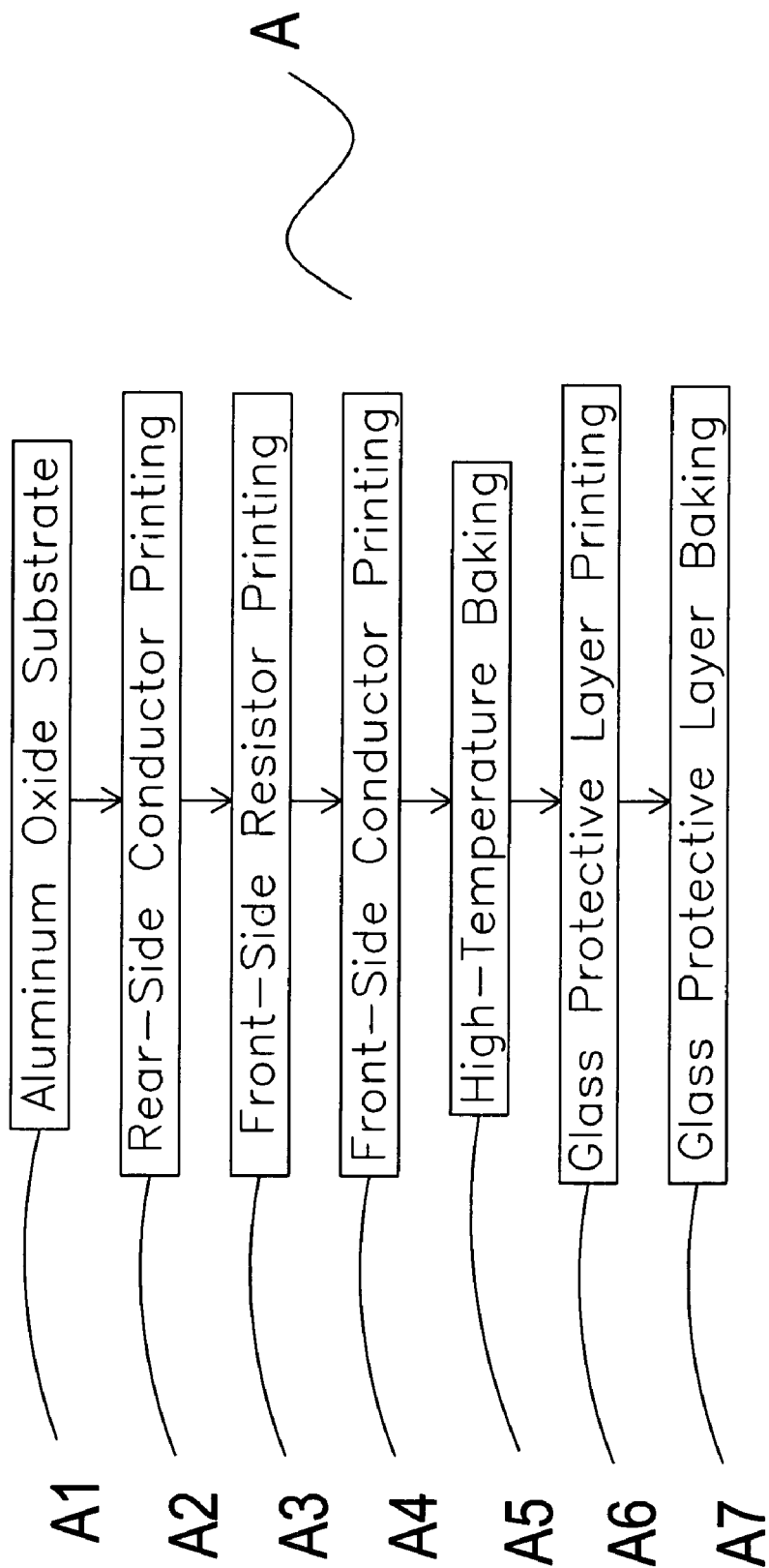
FIG. 1 shows a block diagram of an implementation of a prior art.
Figure 2:
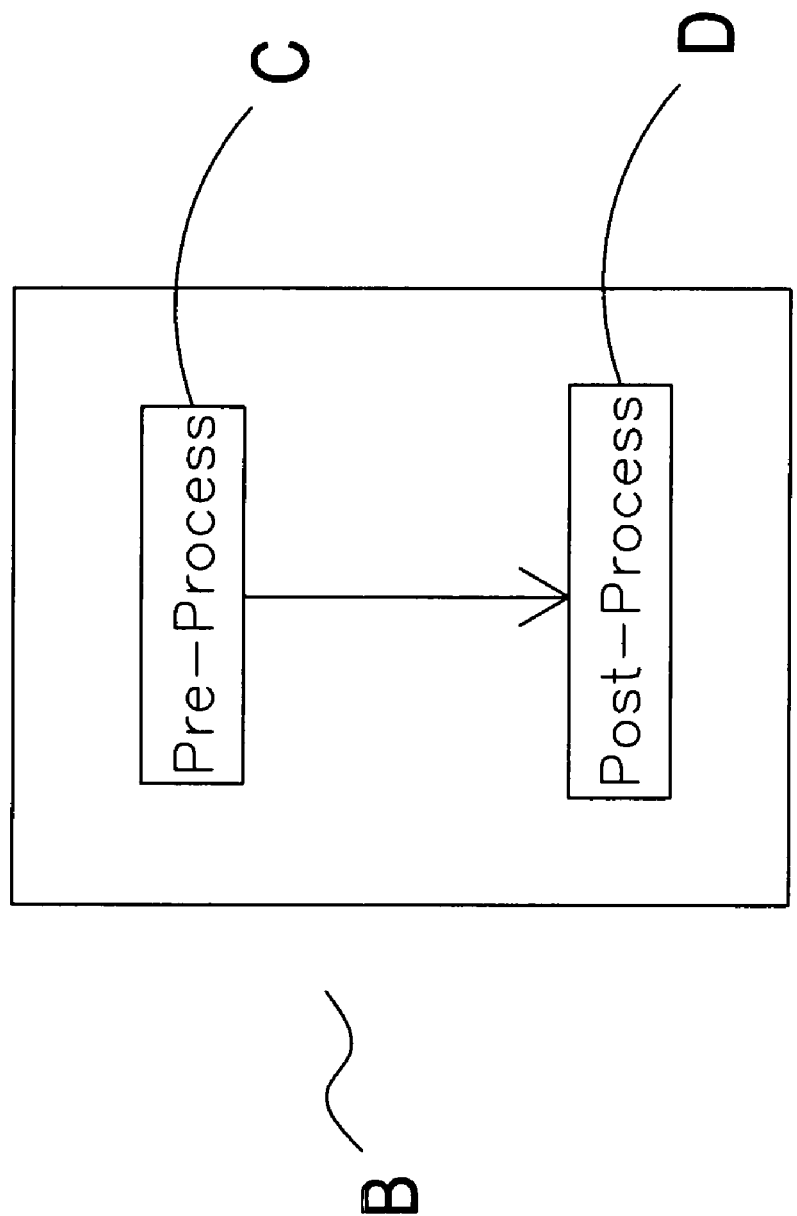
FIG. 2 shows a first block diagram of an implementation of the present invention.
Figure 3:
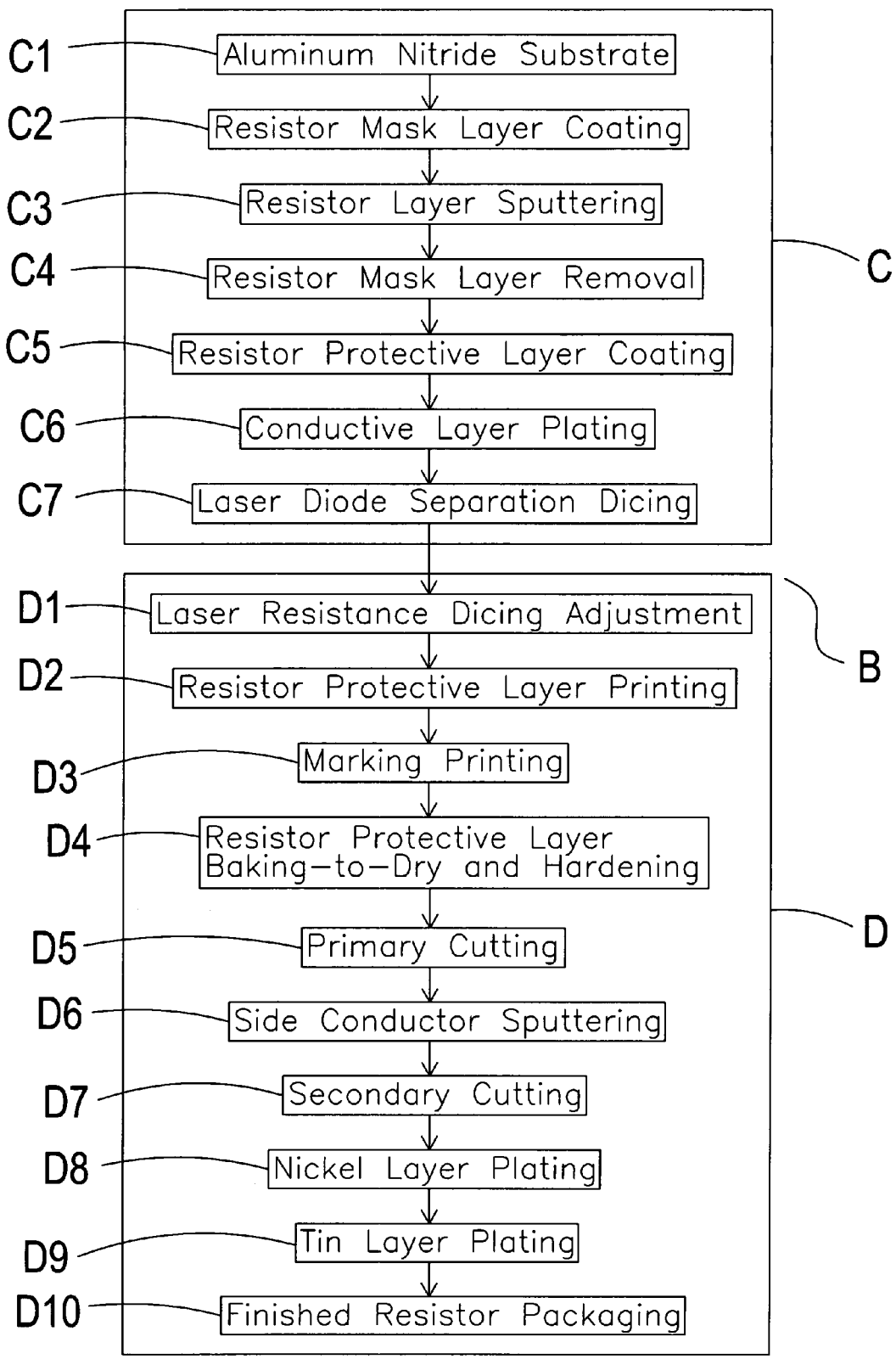
FIG. 3 shows a second block diagram of an implementation of the present invention.

The present invention is to provide a method of making a current sensing chip resistor. Referring to FIG. 2 and FIG. 3, a resistor manufacturing process B comprises a pre-process C and a post-process D. For the pre-process C, a resistor mask layer coating C2 is first performed on an aluminum nitride (AlN) substrate C1, followed by performing a resistor layer sputtering C3. Next, a resistor mask layer removal C4 is performed on the aluminum nitride substrate C1, followed by performing a resistor protective layer coating C5, and then by performing a conductive layer plating C6 on the aluminum nitride substrate C1. Finally, a laser diode separation dicing C7 is performed, and then the post-process D is proceeding.

For the post-process D, a laser resistance dicing adjustment Dl is performed on the aluminum nitride substrate C1 to adjust an accuracy of the resistance, and then a resistor protective layer printing D2 is performed, followed by performing a marking printing D3 on the aluminum nitride substrate C1. After accomplishing the marking printing D3, a resistor protective layer baking-to-dry and hardening D4 is performed, and then a primary cutting D5 is performed on the aluminum nitride substrate C1. Next, a side conductor sputtering D6 is performed on sides of the aluminum nitride substrate C1, followed by a secondary cutting D7. After that, a nickel layer plating D8 is first performed on a surface of the aluminum nitride substrate C1, and then a tin layer plating D9 is performed. After accomplishing the tin layer plating D9, a finished product of resistor is formed, which is then packaged D10 to sell to users in need.

Figure 4:
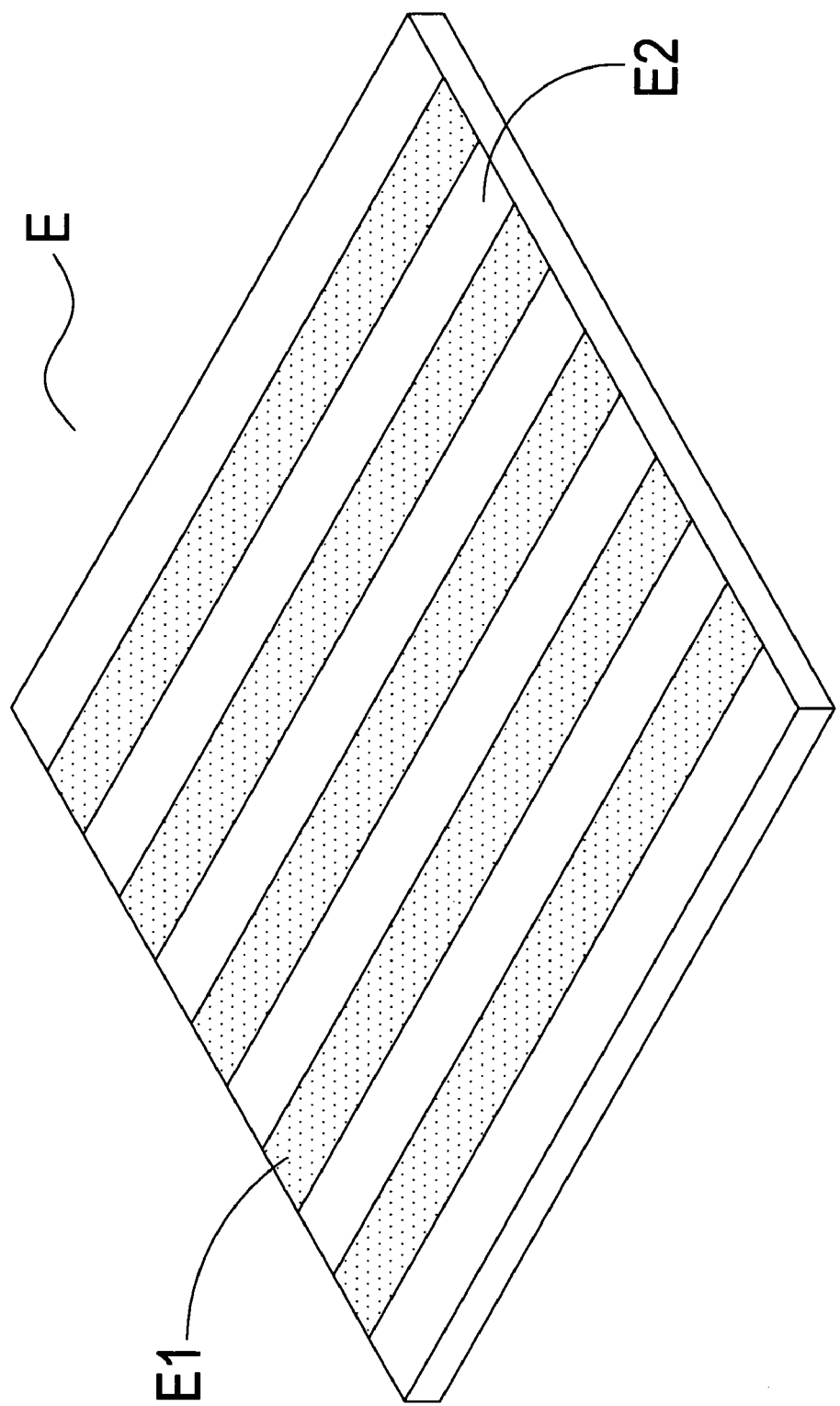
FIG. 4 shows a first schematic view of an embodiment of the present invention.
Figure 5:
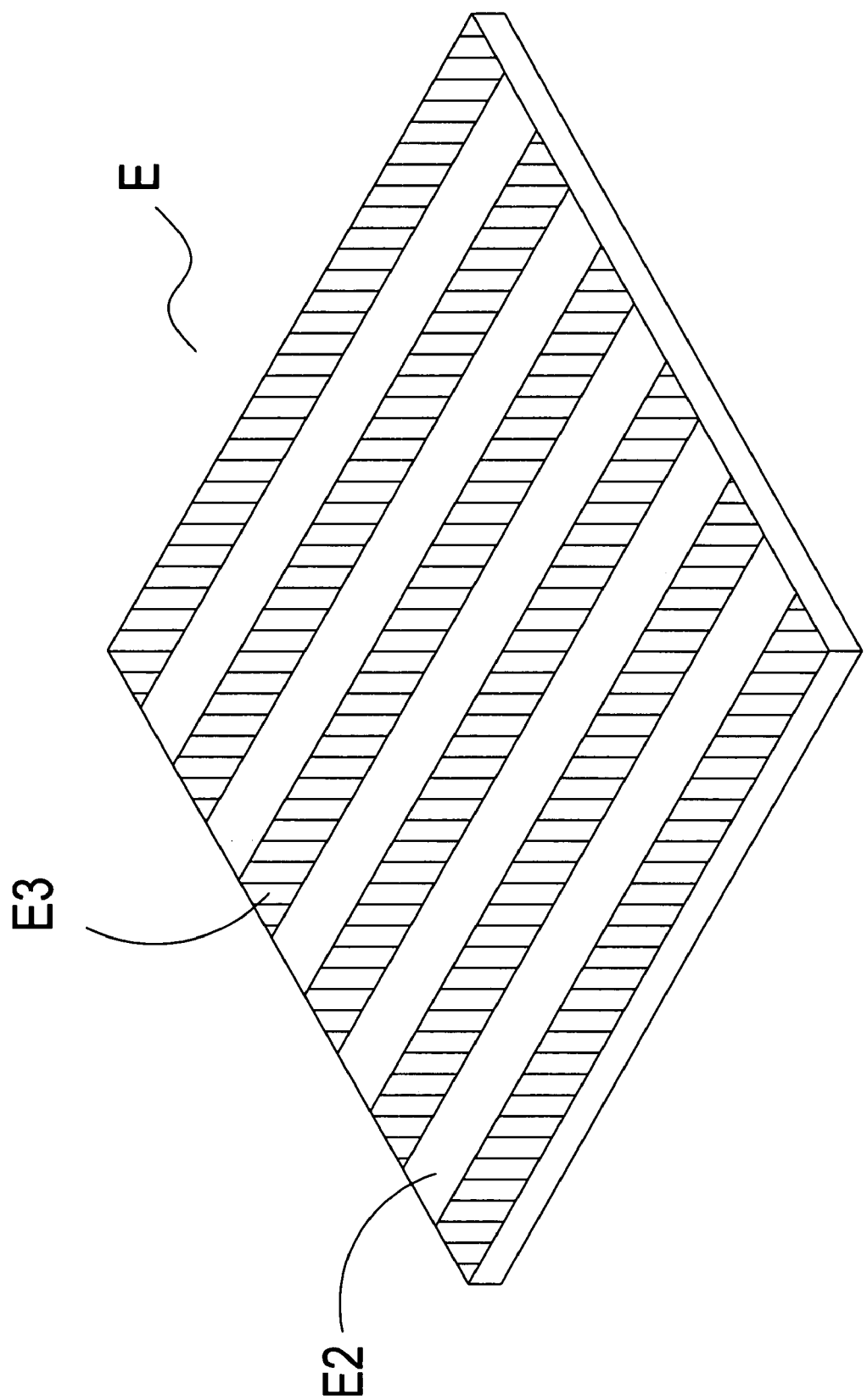
FIG. 5 shows a second schematic view of an embodiment of the present invention.

Referring to FIGS. 3 to 5, the resistor manufacturing process B includes respectively the pre-process C and the post-process D, the substrate material required in making the resistor is an aluminum nitride substrate E, and a thin-film process is used for the resistor manufacturing process B, in association with a technique of flip chip structure of a single-side manufacturing process. Accordingly, the resistor mask layer coating C2 is first performed on the aluminum nitride substrate E, to coat a plurality of stripes of mask layer E1 on a base E2 of the aluminum nitride substrate E. As the mask layer E1 of the base E2 is not conductive, the resistor layer sputtering C3 is then performed on the aluminum nitride substrate E, which coats a film layer on the base E2 of the aluminum nitride substrate E. After coating on the aluminum nitride substrate E, the base E2 of the aluminum nitride substrate E is provided with a resistor layer E3, and then the resistor mask layer C4 is removed, which results in the base E2 of the aluminum nitride substrate E after removing the mask layer E1.

Figure 6:
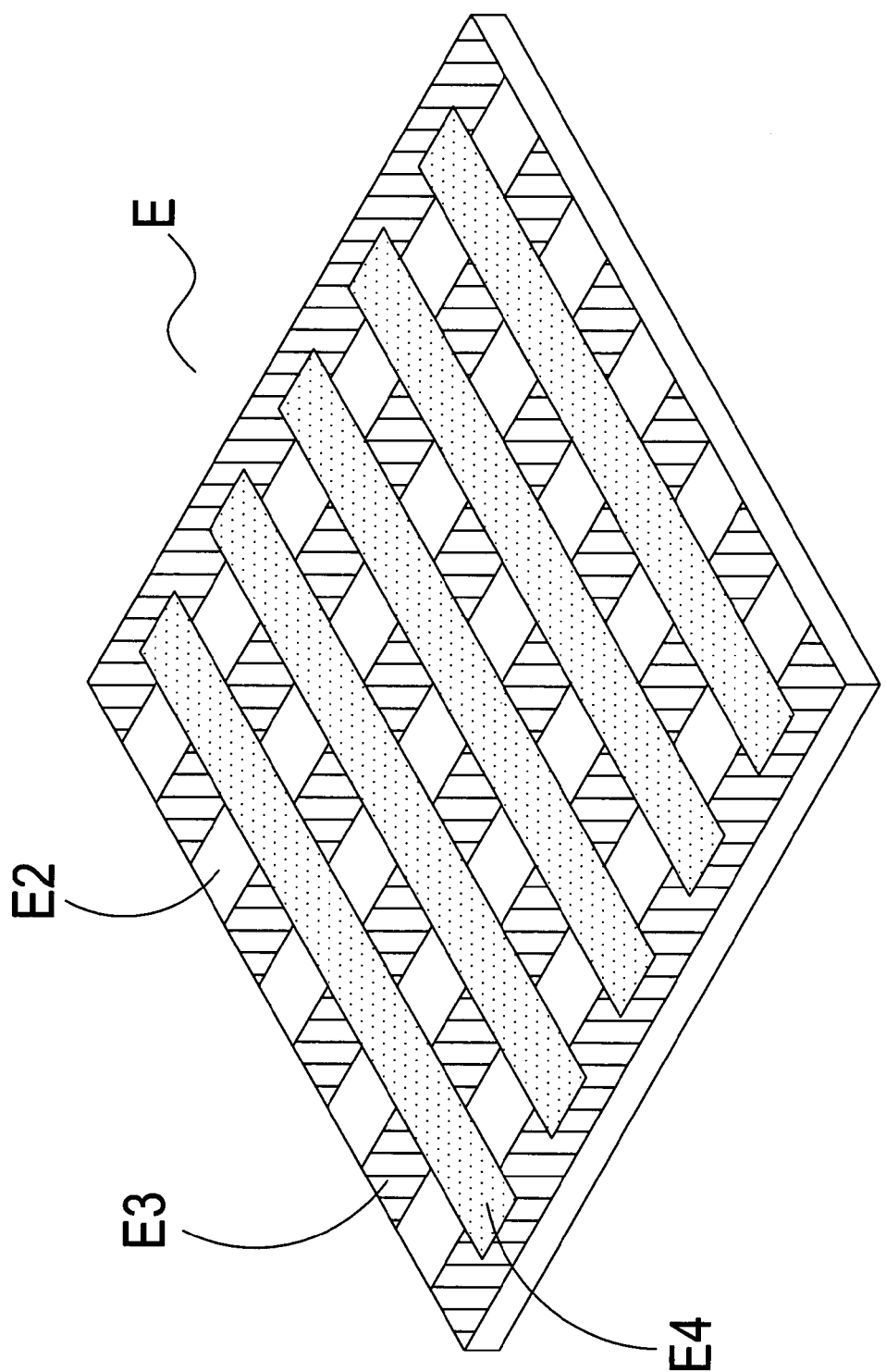
FIG. 6 shows a third schematic view of an embodiment of the present invention.
Figure 7:
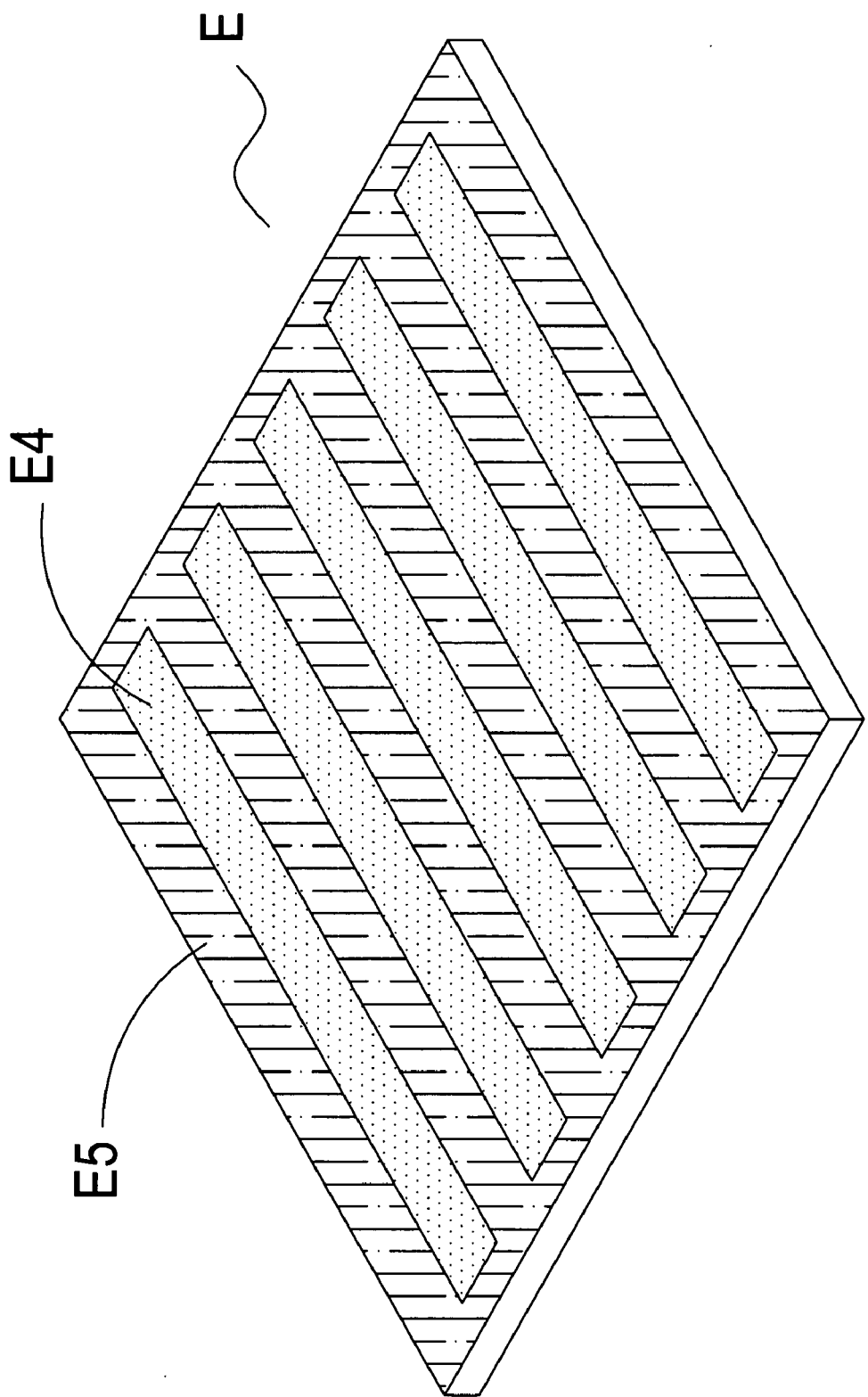
FIG. 7 shows a fourth schematic view of an embodiment of the present invention.

Referring to FIG. 3, FIG. 6, and FIG. 7, after accomplishing the resistor mask layer removal C4 on the aluminum nitride substrate E, the step of resistor protective layer coating C5 is followed, to coat a plurality of stripes of protective layer E4 on the aluminum nitride substrate E, and to form a grid pattern for the protective layer E4 and the resistor layer E3 on the aluminum nitride substrate E. After accomplishing the resistor protective layer coating C5, the conductive layer plating C6 is performed to plate a conductive layer E5 on the aluminum nitride substrate E, at positions where the protective layer E4 is not printed.

Figure 8:
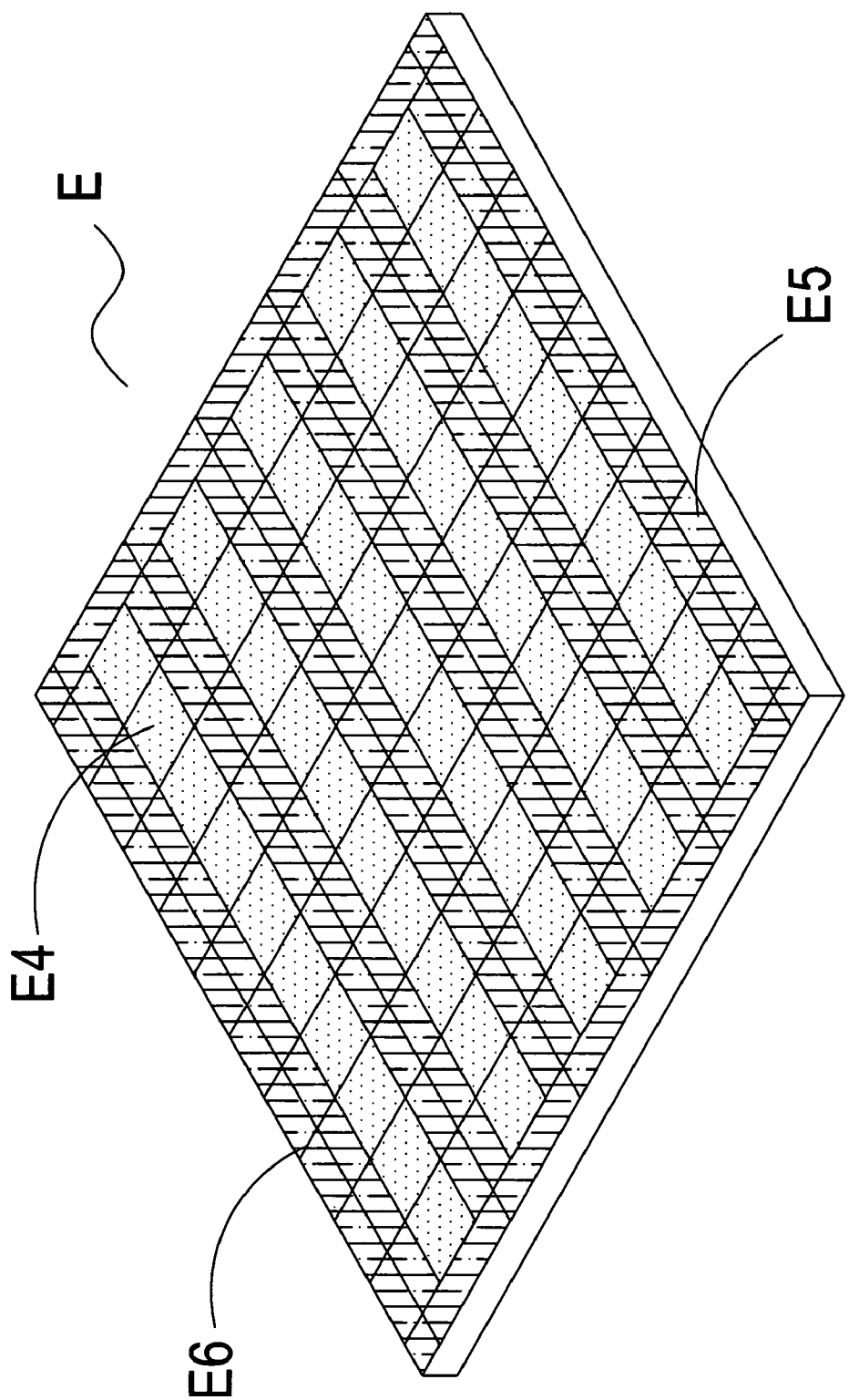
FIG. 8 shows a fifth schematic view of an embodiment of the present invention.
Figure 9:
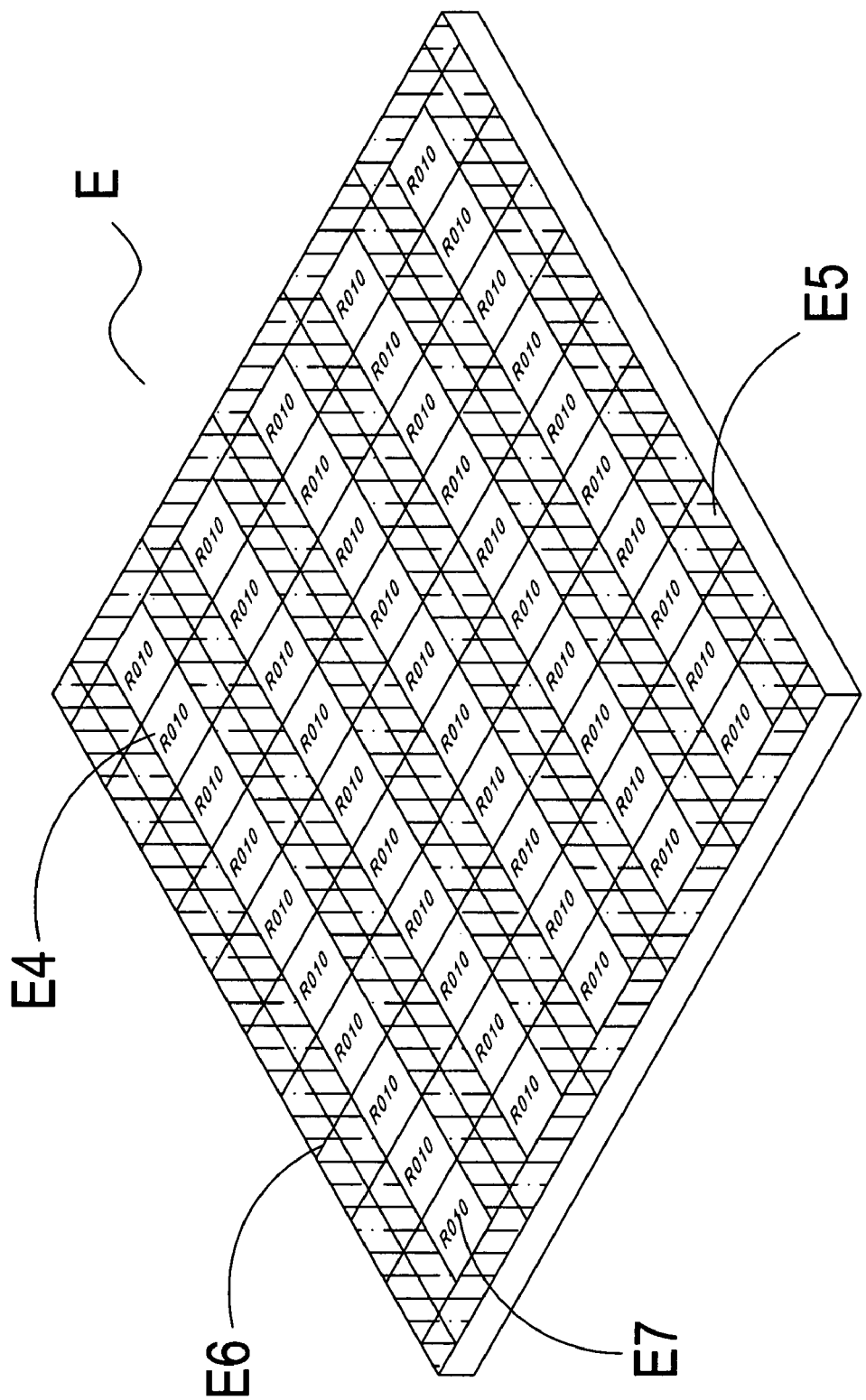
FIG. 9 shows a sixth schematic view of an embodiment of the present invention.

Referring to FIG. 3, FIG. 8, and FIG. 9, after accomplishing the conductive layer plating C6 on the aluminum nitride substrate E, the step of laser diode separation dicing C7 is followed. This laser diode separation dicing C7 uses laser to dice on the aluminum nitride substrate E, to form cutting lines E6 in a grid pattern on the aluminum nitride substrate E, followed by proceeding with the post-process D. When the laser diode separation dicing C7 is accomplished, the laser resistance dicing adjustment is followed to adjust the resistance to an accurate value. After accomplishing the laser resistance dicing adjustment D1, the resistor protective layer printing D2 is performed, and then followed by the marking printing D3, which prints a marking E7 on the protective layer E4 of the aluminum nitride substrate E, thereby allowing a user to be aware of the resistance of this resistor. After accomplishing the marking printing D3, the step of resistor protective layer baking-to-dry and hardening D4 is performed, to bake dry the protective layer E4 of the aluminum nitride substrate E at temperature of 220±10° C.

Figure 10:
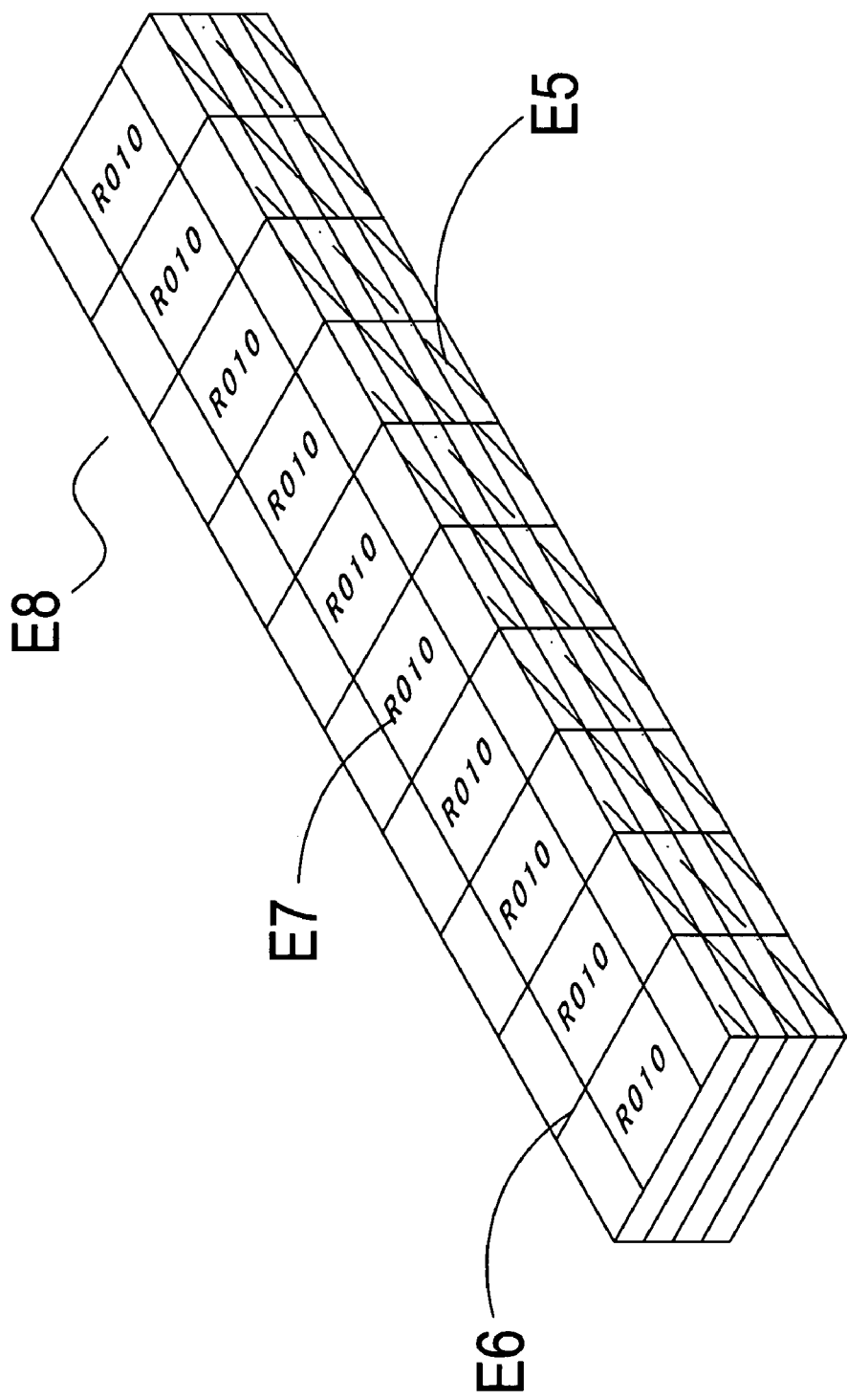
FIG. 10 shows a seventh schematic view of an embodiment of the present invention.
Figure 11:
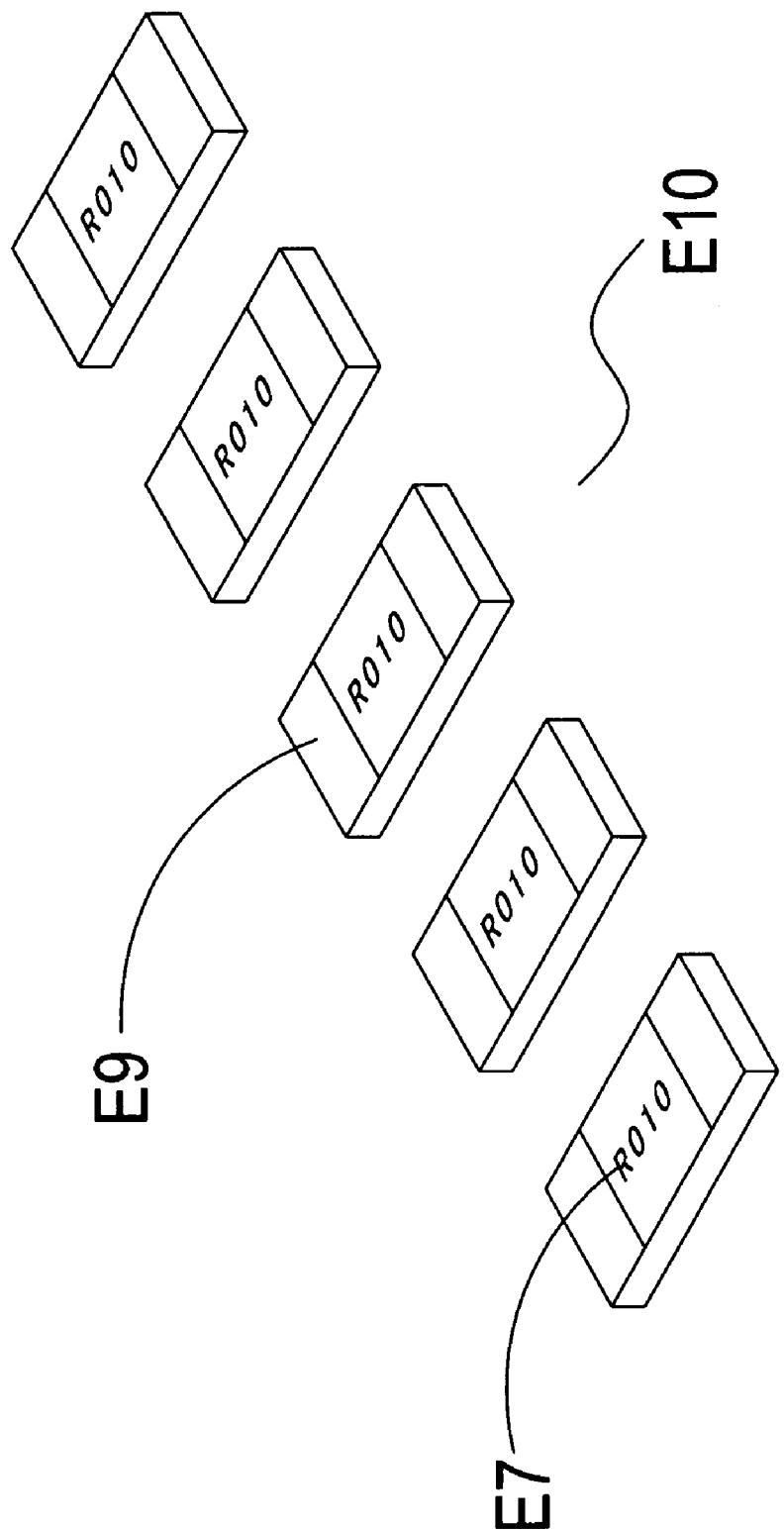
FIG. 11 shows an eighth schematic view of an embodiment of the present invention.

Referring to FIG. 3, FIG. 10, and FIG. 11, after accomplishing the resistor protective layer baking-to-dry and hardening D4, the primary cutting D5 is performed on the aluminum nitride substrate E, which divides the cutting lines E6 which are extended in a direction on the aluminum nitride substrate E to result in a semi-finished product E8. After performing the primary cutting D5, the step of side conductor sputtering D6 is followed, which sputters the conductive layer E5 at sides of the semi-finished product E8, so as to facilitate the user to easily weld and conduct a PCB. After accomplishing the side conductor sputtering D6, the secondary cutting D7 is followed, which divides the cutting lines E6 which are extended along the other direction on the semi-finished product E8, to result in a resistor E10. After accomplishing the secondary cutting D7, the nickel layer plating D8 and the tin layer plating D9 are followed, to plate nickel and tin on a surface E9 of the resistor E10, thereby accomplishing the manufacturing of the resistor E10, and enabling a packaging to the finished resistor product D10.

Referring to FIG. 3, FIG. 11, FIG. 12, and FIG. 13, when making the resistor E10, the thin-film process is utilized, and the aluminum nitride substrate C1 and the technique of flip chip structure of the single-side manufacturing process are employed, so as to achieve performances of a high power (>2 W), a high precision (≦0.5%), a high thermal conductivity (150~230 mW), and a saving of utilization space of the PCB (30%).

To further manifest the advancement and practicability of the present invention, the advantages thereof are listed as follow:

1. The aluminum nitride substrate, thin-film process, and flip chip structure of the single-side manufacturing process are used.
2. According to item 1, the performance of high power (>2 W) can be resulted.
3. According to item 1, the performance of high precision (≦0.5%) can be resulted.
4. According to item 1, the performance of high thermal conductivity (150~230 mW) can be resulted.
5. According to item 1, the saving of utilization of PCB (30%) can be achieved.
6. It is provided with industrial competitiveness.
7. It is provided with a value of business utilization.
8. It is provided with novelty.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A method of making a current sensing chip resistor, comprising a resistor manufacturing process comprised of a pre-process and a post-process,
   wherein the pre-process further comprises the following sequential steps:
      performing a resistor mask layer coating on an aluminum nitride substrate;
      performing a resistor layer sputtering;
      removing a resistor mask layer;
      performing a resistor protective layer coating;
      performing a conductive layer plating on the aluminum nitride substrate;
      performing a laser diode separation dicing;
   performing the post-processing, the post processing comprising the following sequential steps:
      performing a laser resistance dicing adjustment to adjust the accuracy of the resistance;
      performing a resistor protective layer printing;
      performing a marking printing;
      performing a resistor protective layer baking-to-dry and hardening;
      performing a primary cutting on the aluminum nitride substrate;
      performing a side conductor sputtering;
      performing a secondary cutting;
      performing a nickel layer plating;
      performing a tin layer plating; and
      packaging the apparatus,
      wherein a thin-film process is used for the resistor manufacturing process and the aluminum nitride substrate,
      wherein the thin-film process uses a single-side flip chip structure manufacturing process.

* * * * *